(12) United States Patent
Jo et al.

(10) Patent No.: US 10,868,520 B2
(45) Date of Patent: Dec. 15, 2020

(54) CONTROL BUFFER CIRCUIT AND RADIO FREQUENCY SWITCH DEVICE

(71) Applicant: SAMSUNG ELECTRO-MECHANICS CO., LTD., Suwon-si (KR)

(72) Inventors: Byeong Hak Jo, Suwon-si (KR); Jeong Hoon Kim, Suwon-si (KR); Hyun Paek, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/265,145

(22) Filed: Feb. 1, 2019

(65) Prior Publication Data

US 2020/0021276 A1 Jan. 16, 2020

(30) Foreign Application Priority Data

Jul. 10, 2018 (KR) .......................... 10-2018-0080134

(51) Int. Cl.
*H03K 17/56* (2006.01)
*H03K 3/01* (2006.01)

(52) U.S. Cl.
CPC .............. *H03K 3/01* (2013.01); *H03K 17/56* (2013.01)

(58) Field of Classification Search
CPC ................................ H03K 3/01; H03K 17/56
See application file for complete search history.

(56) References Cited

U.S. PATENT DOCUMENTS

| | | | |
|---|---|---|---|
| 6,850,108 B2* | 2/2005 | Shin ................. | H03K 19/00315 326/82 |
| 7,336,101 B2* | 2/2008 | Kim .................... | H03K 19/0185 326/81 |
| 8,729,952 B2* | 5/2014 | Yang .................... | H03K 17/162 327/434 |
| 8,829,981 B2* | 9/2014 | Peachey .................... | G05F 3/16 327/537 |
| 10,148,298 B2* | 12/2018 | Jo ........................ | H03K 17/162 |
| 2015/0214931 A1 | 7/2015 | Yoo et al. | |
| 2018/0145708 A1 | 5/2018 | Jo et al. | |

FOREIGN PATENT DOCUMENTS

| KR | 10-2011-0089635 A | 8/2011 |
|---|---|---|
| KR | 10-1616608 B1 | 4/2016 |
| KR | 10-1823269 B1 | 1/2018 |

\* cited by examiner

*Primary Examiner* — Dinh T Le
(74) *Attorney, Agent, or Firm* — NSIP Law

(57) ABSTRACT

A radio frequency switch includes a control buffer circuit to generate a first gate voltage and a first body voltage; and a switching circuit to switch at least one signal path in response to the first gate voltage and the first body voltage. The control buffer circuit includes an off voltage detection circuit to detect whether the off voltage is a negative voltage or a ground voltage and output a voltage detection signal, a first gate buffer circuit to output a first gate voltage having a voltage level based on the voltage detection signal and the band selection signal, and a first body buffer circuit to output a first body voltage having a voltage level based on the voltage detection signal, the band selection signal, and the mode signal.

16 Claims, 11 Drawing Sheets

CONTROL BUFFER CIRCUIT AND RADIO FREQUENCY SWITCH DEVICE

CROSS-REFERENCE TO RELATED APPLICATION

This application claims the benefit under 35 U.S.C. § 119(a) of Korean Patent Application No. 10-2018-0080134 filed on Jul. 10, 2018 in the Korean Intellectual Property Office, the entire disclosure of which is incorporated herein by reference for all purposes.

BACKGROUND

1. Field

The following description relates to a control buffer circuit and a radio frequency switch device.

2. Description of Background

In general, since a power amplifier module (PAM) supports various frequency bands, the PAM may include a radio frequency (RF) switch for selecting a plurality of bands, a filter, and a plurality of power amplifiers (PAs) for amplifying an RF signal.

Since a shape of the RF switch may change according to a configuration of a PA and the filter, and such a PA is commonly designed to have a wide band, including a plurality of bands, a single-pole-multi-throw (SPMT) switch having one input port and a plurality of output ports may be used as the RF switch.

One PAM usually includes a plurality of SPDT switches. Some of the SPDT switches may use a negative voltage as an off path for an off path processing a high power signal and isolation and the other SPDT switches may use a zero voltage (or a ground voltage) as the off voltage without using the negative voltage when processing a low power signal.

However, since the conventional PAM includes SPDT switches using different off voltages, and the SPDT switches using different off voltages are separately produced through different manufacturing processes, the manufacturing cost of the SPDT switch is increased, and accordingly, there is a problem in that the manufacturing costs of the PAM may also be increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A control buffer circuit and a radio frequency switch device capable of selecting a ground voltage or a negative voltage as a body off voltage in an off state.

In one general aspect, a control buffer circuit of a radio frequency switch includes an off voltage detection circuit to detect whether an off voltage, supplied from an external source, is a negative voltage or a ground voltage and output a voltage detection signal having a voltage level based on whether the off voltage is the negative voltage or the ground voltage; a first gate buffer circuit to output a first gate voltage having a voltage level based on the voltage detection signal and a band selection signal; and a first body buffer circuit to output a first body voltage having a voltage level based on the voltage detection signal, the band selection signal, and a mode signal.

In a case in which the off voltage is the ground voltage, the first body voltage may be the ground voltage, and in a case in which the off voltage is the negative voltage, the first body voltage may be one of the negative voltage and the ground voltage, according to the mode signal.

The first gate buffer circuit may include a VNEG buffer to output one of a positive voltage and the negative voltage as the first gate voltage according to a first band selection signal in a case in which the voltage detection signal is a first voltage; and a VSS buffer to output one of the positive voltage and the ground voltage as the first gate voltage according to the first band selection signal in a case in which the voltage detection signal is a second voltage.

The first body buffer circuit may include a VNEG buffer to output one of the ground voltage and the negative voltage as the first body voltage according to the first band selection signal in the case in which the voltage detection signal is a first voltage; and a VSS buffer to output the ground voltage as the first body voltage according to the first band selection signal in the case in which the voltage detection signal is a second voltage.

The first gate buffer circuit may output the positive voltage as the first gate voltage in a switching on mode, based on the band selection signal, and may output one of the negative voltage and the ground voltage as the first gate voltage in a switching off mode, based on the voltage detection signal and the band selection signal.

The first body buffer circuit may output the ground voltage as the first body voltage in the switching on mode, based on the band selection signal, and may output one of the negative voltage and the ground voltage as the first body voltage in the switching off mode, based on the voltage detection signal, the mode signal, and the band selection signal.

The first gate buffer circuit and the first body buffer circuit may output, in the switching off mode, based on the voltage detection signal and the mode signal, as a pair of the first gate voltage and the first body voltage, one of a pair of the negative voltage and the negative voltage, a pair of the ground voltage and the ground voltage, and a pair of the negative voltage and the ground voltage.

The off voltage detection circuit may output the voltage detection signal with a first voltage in a case in which the off voltage is the negative voltage, and may output the voltage detection signal with a second voltage different from the first voltage in a case in which the off voltage is the ground voltage.

In another general aspect, a radio frequency switch includes a control buffer circuit to generate a first gate voltage and a first body voltage, based on a band selection signal, an off voltage, supplied from an external source, and a mode signal; and a switching circuit to switch at least one signal path in response to the first gate voltage and the first body voltage. The control buffer circuit includes: an off voltage detection circuit to detect whether the off voltage is a negative voltage or a ground voltage and output a voltage detection signal having a voltage level based on whether the off voltage is the negative voltage or the ground voltage; a first gate buffer circuit to output the first gate voltage having a voltage level based on the voltage detection signal and the band selection signal; and a first body buffer circuit to output the first body voltage having a voltage level based on the voltage detection signal, the band selection signal, and the mode signal.

In a case in which the off voltage is the ground voltage, the first body voltage may be the ground voltage, and in a case in which the off voltage is the negative voltage, the first body voltage may be one of the negative voltage and the ground voltage, according to the mode signal.

The first gate buffer circuit may include a VNEG buffer to output one of a positive voltage and the negative voltage as the first gate voltage according to a first band selection signal in a case in which the voltage detection signal is a first voltage; and a VSS buffer to output one of the positive voltage and the ground voltage as the first gate voltage according to the first band selection signal in a case in which the voltage detection signal is a second voltage.

The first body buffer circuit may include a VNEG buffer to output one of the ground voltage and the negative voltage as the first body voltage according to the first band selection signal in the case in which the voltage detection signal is the first voltage; and a VSS buffer to output the ground voltage as the first body voltage according to the first band selection signal in the case in which the voltage detection signal is the second voltage.

The first gate buffer circuit may output the positive voltage as the first gate voltage in a switching on mode, based on the band selection signal, and may output one of the negative voltage and the ground voltage as the first gate voltage in the switching off mode, based on the voltage detection signal and the band selection signal.

The first body buffer circuit may output the ground voltage as the first body voltage in the switching on mode, based on the band selection signal, and may output one of the negative voltage and the ground voltage as the first body voltage in the switching off mode, based on the voltage detection signal, the mode signal, and the band selection signal.

The first gate buffer circuit and the first body buffer circuit may output, in the switching off mode, based on the voltage detection signal and the mode signal, as a pair of the first gate voltage and the first body voltage, one of a pair of the negative voltage and the negative voltage, a pair of the ground voltage and the ground voltage, and a pair of the negative voltage and the ground voltage.

The off voltage detection circuit may output the voltage detection signal having a first voltage when the off voltage is the negative voltage and may be configured to output the voltage detection signal having a second voltage different from the first voltage when the off voltage is the ground voltage.

In another general aspect, a radio frequency switch includes: a control buffer circuit to output a series gate voltage, a shunt gate voltage, a series body voltage, and a shunt body voltage; and a series transistor to perform a switching on or off operation in response to the series gate voltage and the series body voltage.

The radio frequency switch may include a shunt transistor to perform a switching on or off operation in response to the shunt gate voltage and the shunt body voltage.

The radio frequency switch may include a series switch that includes the series transistor and a shunt switch that includes the shunt transistor, and the shunt switch may be connected between one end of the series switch and a ground.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
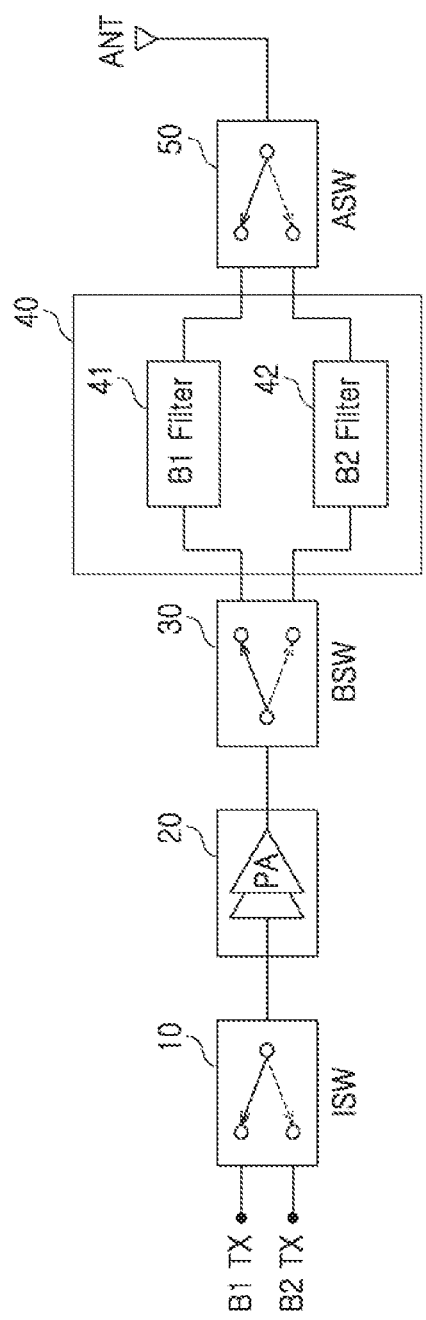
FIG. 1 is a diagram illustrating an application of a radio frequency switch device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

FIG. 1 is a diagram illustrating an application of a radio frequency switch device according to an example.

A power amplifier module (PAM) shown in FIG. 1 may include an input switch ISW 10 for selecting a band signal, a power amplifier PA 20 for amplifying the selected band signal, a band switch BSW 30 for separating the amplified band signal, a filter circuit 40 including a first band filter 41 and a second band filter 42 for filtering the separated band signal, and an antenna switch ASW 50 for selecting and outputting the filtered band signal.

The radio frequency switch device may be applied to the input switch ISW 10, the band switch BSW 30 and the antenna switch ASW 50 shown in FIG. 1. Each of the input switch ISW 10, the band switch BSW 30 and the antenna switch ASW 50 may be formed by stacking a plurality of transistors. Each of the plurality of transistors may include a drain, a source, a gate, and a body.

Figure 2:
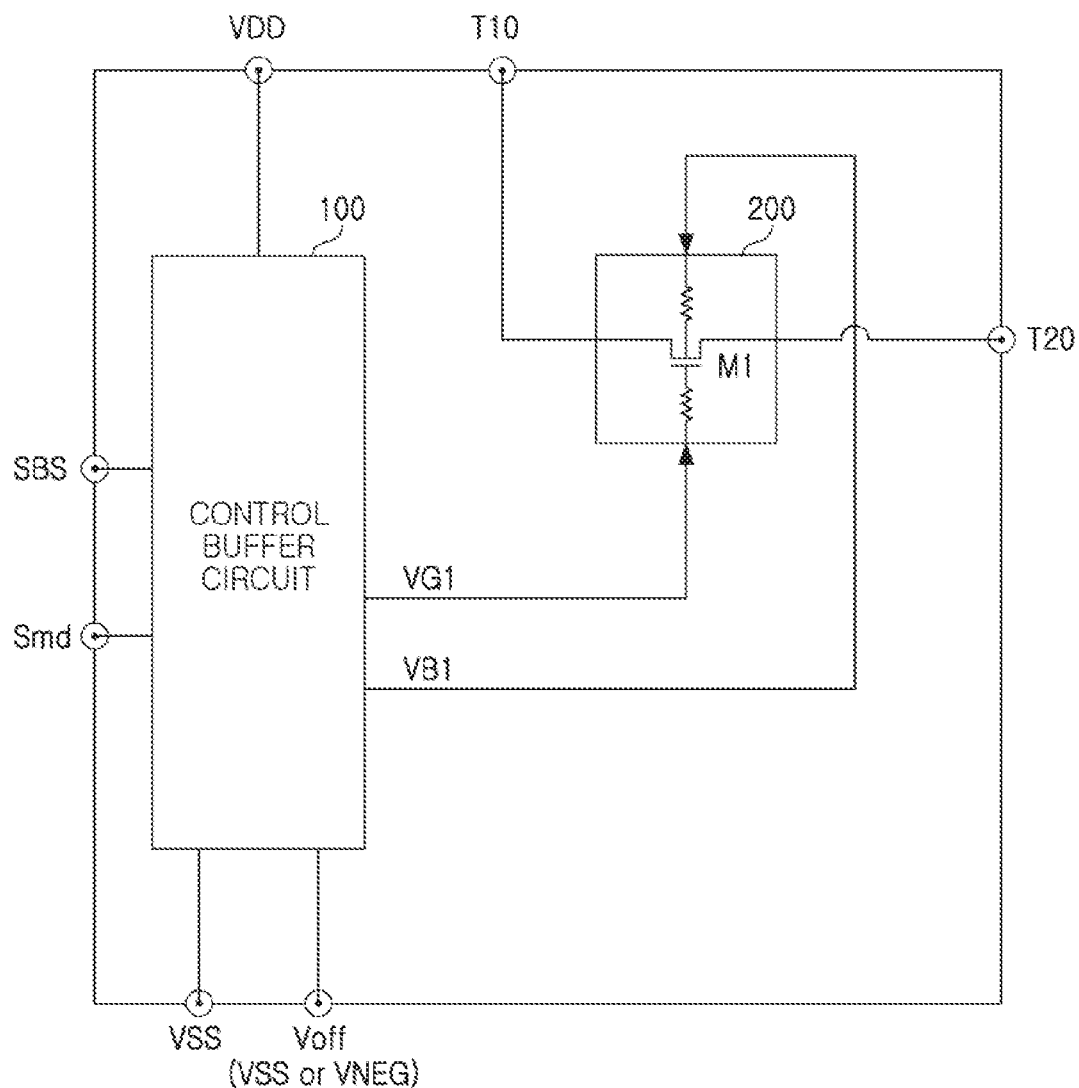
FIG. 2 is a diagram of a radio frequency switch device according to an example.

Referring to FIGS. 1 and 2, the input switch ISW 10 used for an input of the power amplifier PA may be supplied with a ground voltage VSS as an off voltage Voff, and the band switch BSW 30 and the antenna switch ASW 50 used for an output of the power amplifier PA may be supplied with a negative voltage VNEG as the off voltage Voff.

In the case of the band switch BSW 30, the largest power among power modules must be handled. For example, if the output of the power amplifier PA is 30 dBm, magnitude of a signal applied to the antenna switch ASW 50 will be about 27 dBm with loss of a filter circuit and elements of passive matching.

The harmonic characteristic of the band switch BSW 30 may not be important. Because the first and second band filters 41 and 42 are present, the harmonic characteristic of the band switch BSW 30 is not a factor more important than the antenna switch ASW 50.

The power handling capability (PHC) of the antenna switch ASW 50 may be lower than that the PHC of the band switch BSW 30 because the antenna switch ASW 50 operates at a power 3 dB lower than the band switch BSW 30. However, a harmonic characteristic may be important because the antenna switch ASW 50 is located directly in front of the antenna ANT.

As described above, in order to use all the input switch ISW 10, the band switch BSW 30 and the antenna switch ASW 50 with one radio frequency switch device, it is necessary to minimize the number of stacks and to use the off voltage Voff appropriately.

The number of stacks must be set in accordance with the band switch BSW 30 having the largest PHC. The number of stacks and the harmonic characteristic of the RF switch device are most closely related to a body off voltage Vb_off, discussed as follows.

When the body off voltage Vb_off is the ground voltage VSS, a body-drain breakdown voltage BVbd is relaxed such that the number of stacks may be reduced more than the number of stacks when the negative voltage VNEG is used. However, the harmonic characteristic deteriorates due to a turn-on condition of a base-source diode.

When the body off voltage Vb_off is the negative voltage VNEG, the PHC is lowered, and the harmonic characteristic is improved.

As described above, one radio frequency switch device according to an example may be applied to the input switch ISW 10, the band switch BSW 30 and the antenna switch ASW, by selecting one of the ground voltage VSS and the negative voltage VNEG as the body off voltage Vb_off according to an applied position, and the characteristic required for each position may be optimally satisfied.

Hereinafter, a radio frequency switch device and a control buffer circuit will be described.

FIG. 2 is a diagram of a radio frequency switch device according to an example.

Referring to FIG. 2, the radio frequency switch device may include a control buffer circuit 100 and a switching circuit 200.

The control buffer circuit 100 may generate the first gate voltage VG1 and the first body voltage VB1 based on a band selection signal SBS, the off voltage Voff supplied from the outside, and a mode signal Smd.

The switching circuit 200 may include at least a first transistor M1 connected between a first terminal T10 and a second terminal T20. The first transistor M1 may perform a switching on or off operation in response to the first gate voltage VG1 and the first body voltage VB1.

In FIG. 2, the switching circuit 200 may include the first transistor M1, but may also include a plurality of transistors stacked in series between the first terminal T10 and the second terminal T20. In each of the example, for convenience of explanation and understanding, the first transistor M1 may represent the plurality of transistors.

For example, +VDD is a positive operating voltage (e.g., 2.5V), −VDD is a negative operating voltage (e.g., −2.5V), and VSS is a zero operating voltage (e.g., 0V). A positive voltage is a positive voltage higher than a ground voltage, and a negative voltage is a negative voltage lower than the ground voltage.

For each drawing figure, unnecessary redundant explanations may be omitted for components having the same reference numeral and the same function, and differences for each figure may be explained.

Figure 3:
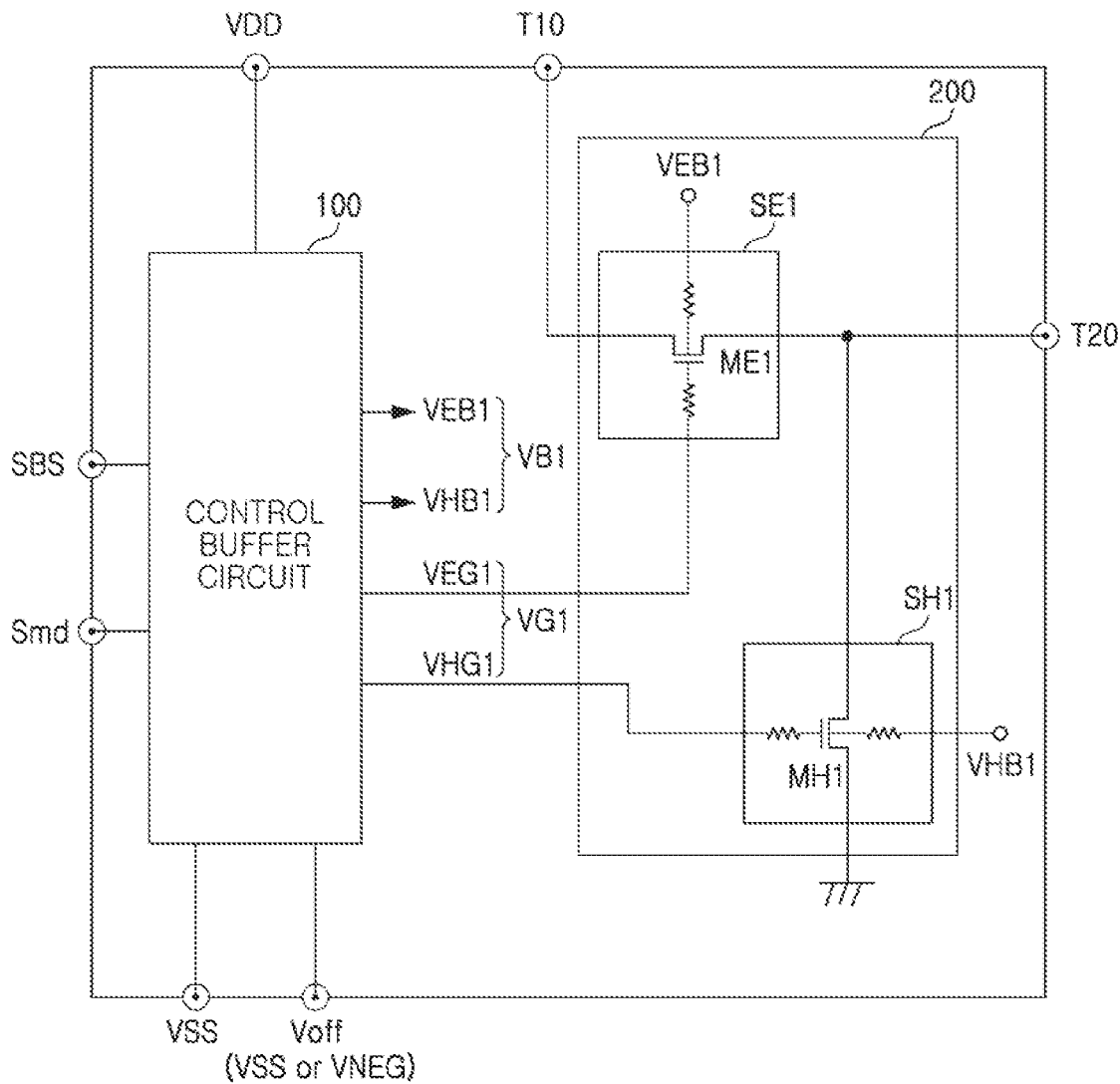
FIG. 3 is a diagram of a radio frequency switch device according to an example.

FIG. 3 is a diagram of a radio frequency switch device according to an example.

Referring to FIG. 3, the radio frequency switch device may include the control buffer circuit 100 and the switching circuit 200.

For example, the control buffer circuit 100 may generate the first gate voltage VG1 and the first body voltage VB1 based on the band selection signal SBS, the off voltage Voff supplied from the outside and the mode signal Smd.

For example, the first gate voltage VG1 may include a first series gate voltage VEG1 and a first shunt gate voltage VHG1, and the first body voltage VB1 may include a first series body voltage VEB1 and a first shunt body voltage VHB1.

The switching circuit 200 may include a first series switch SE1 and a first shunt switch SH1 that are connected between the first terminal T10 and the second terminal T20 and perform a switching on or off operation in response to the first gate voltage VG1 and the first body voltage VB1.

The first series switch SE1 may include at least a first series transistor ME1 connected in series between the first terminal T10 and the second terminal T20 and the first shunt switch SH1 may include at least a first shunt transistor MH1 connected between one end of the first series switch SE1 and the ground.

The first series transistor ME1 may perform the switching on or off operation in response to the first series gate voltage VEG1 and the first series body voltage VEB1. For example, the first series gate voltage VEG1 and the first series body voltage VEB1 may be a positive voltage and a ground voltage, a ground voltage and a ground voltage, a negative voltage and a negative voltage, or a negative voltage and a ground voltage.

The first shunt transistor MH1 may perform the switching on or off operation in response to the first shunt gate voltage VHG1 and the first shunt body voltage VHB1. For example, the first shunt gate voltage VHG1 and the first shunt body voltage VHB1 may be a positive voltage and a ground voltage, a ground voltage and a ground voltage, a negative voltage and a negative voltage, or a negative voltage and a ground voltage.

Meanwhile, in FIG. 3, the first series switch SE1 may include a plurality of series transistors connected in series between the first terminal T10 and the second terminal T20. For convenience of explanation and understanding, the first series transistor ME1 may be a representative series transistor of the plurality of series transistors.

The first shunt switch SH1 may include a plurality of shunt transistors connected in series between one end of the first series switch SE1 and the ground. For convenience of explanation and understanding, the first shunt transistor MH1 may be a representative shunt transistor of the plurality of shunt transistors.

For example, when the band selection signal SBS is in a switching on mode, a positive voltage (e.g., +VDD) and a ground voltage (e.g., VSS) may be output as the first gate voltage VG1 and the first body voltage VB1.

In another example, when the selection signal SBS is in a switching off mode, the voltage may be output according to the off voltage Voff and the mode signal Smd. That is, if the off voltage Voff is the ground voltage, the ground voltage may be output as the first gate voltage VG1 and the first body voltage VB1. Alternatively, if the off voltage Voff is the negative voltage VNEG, the negative voltage may be output as the first gate voltage VG1, and one of a negative voltage (e.g., −VDD) and a ground voltage (e.g., VSS) may be selected and output according to the mode signal Smd as the first body voltage VB1. This will be described in greater detail below.

Figure 4:
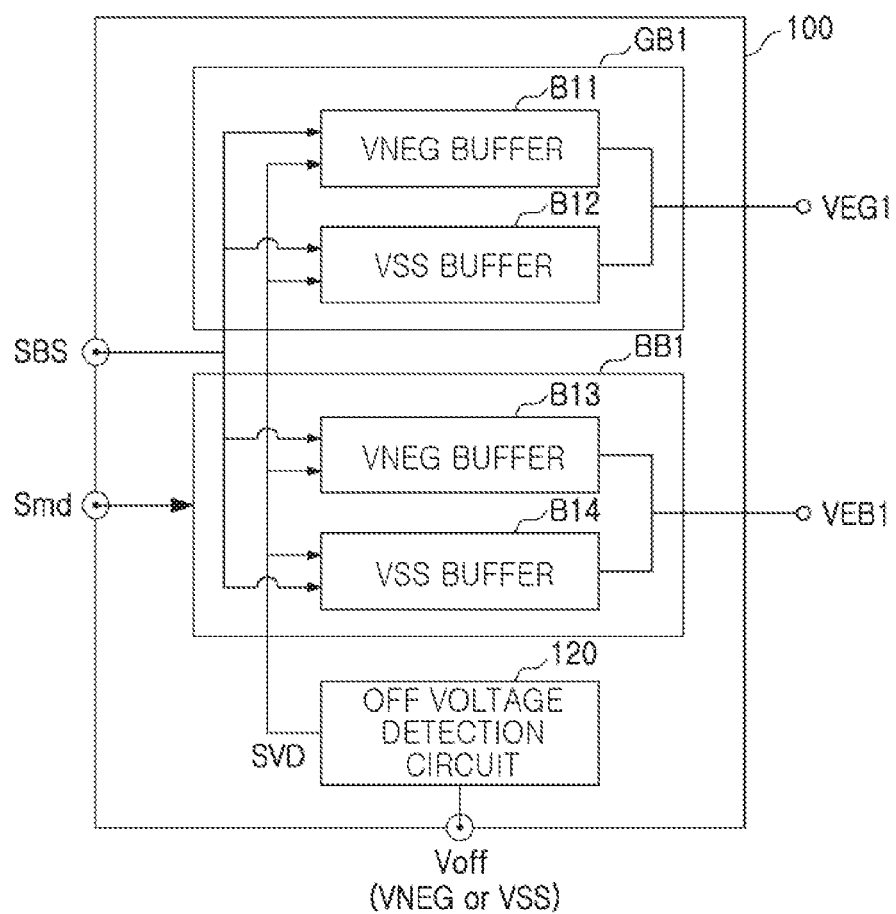
FIG. 4 is a diagram of a control buffer circuit according to an example.

FIG. 4 is a diagram of a control buffer circuit according to an example.

Referring to FIG. 4, the control buffer circuit 100 may include an off voltage detection circuit 120, a first gate buffer circuit GB1, and a first body buffer circuit BB1.

Figure 5:
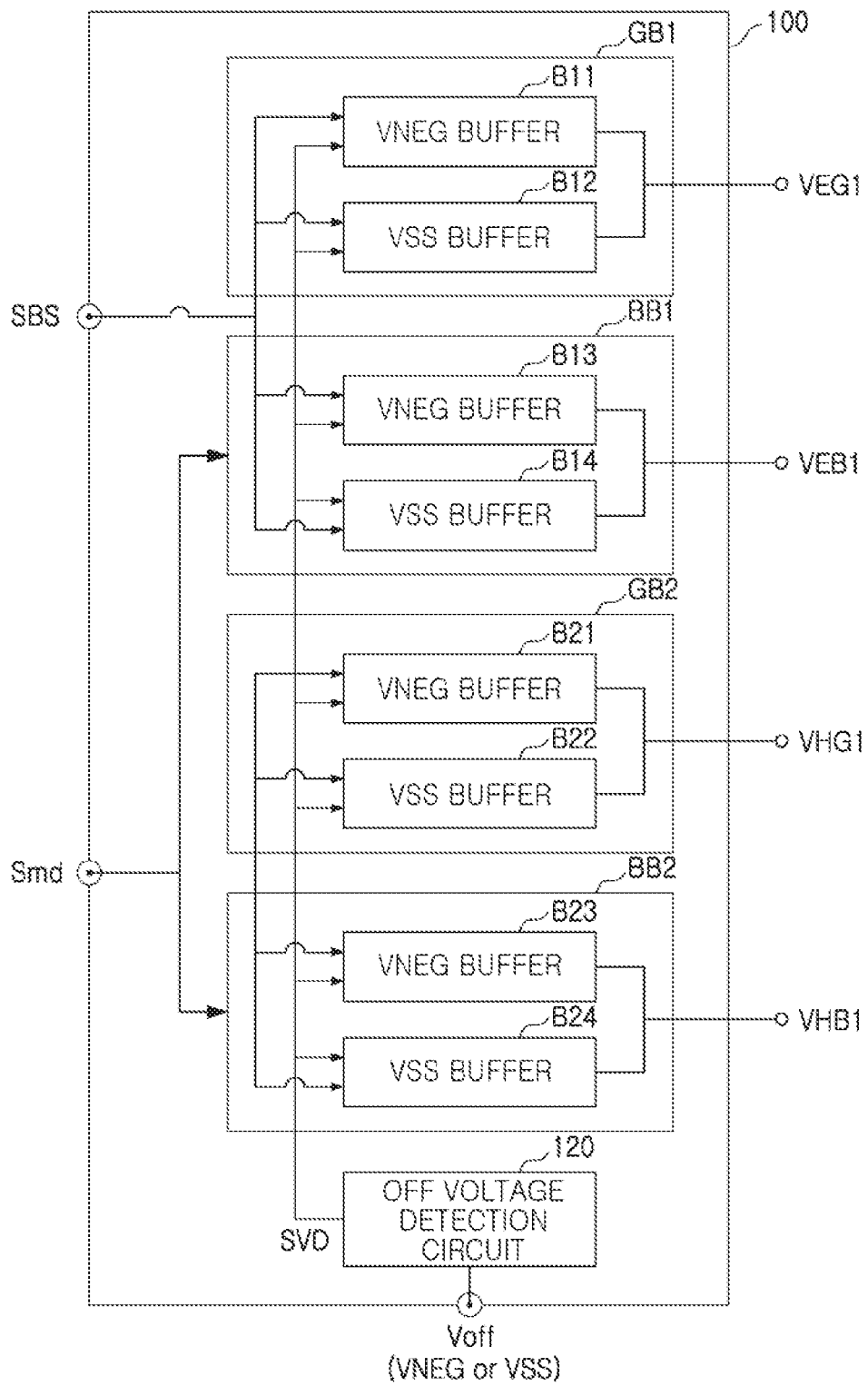
FIG. 5 is a diagram of a control buffer circuit according to an example.

FIG. 5 is a diagram of a control buffer circuit according to an example.

Referring to FIG. 5, the control buffer circuit 100 may include the off voltage detection circuit 120, a first gate buffer circuit GB1, a first body buffer circuit BB1, a second gate buffer circuit GB2, and a second body buffer circuit BB2.

Referring to FIGS. 4 and 5, the off voltage detection circuit 120 may detect whether the off voltage Voff is the negative voltage VNEG or a ground voltage (e.g., VSS) and may output a voltage detection signal SVD having a voltage level according to the detection. For example, if the off voltage Voff is the negative voltage VNEG, the voltage detection signal SVD may be a first voltage of a high level. If the off voltage Voff is a ground voltage (e.g., VSS), the voltage detection signal SVD may be a second voltage of a low level.

The first gate buffer circuit GB1 may output the first gate voltage VEG1 having a voltage level determined based on the band selection signal SBS and the voltage detection signal SVD. For example, when the band selection signal SBS is a corresponding band selection signal, the first gate voltage VEG1 may be a positive voltage, and when the band selection signal SBS is not the band selection signal, the first gate voltage VEG1 may be one of a ground voltage (e.g., VSS) and the negative voltage VNEG based on the voltage detection signal SVD. That is, if the off voltage Voff is a ground voltage (e.g., VSS) based on the voltage detection signal SVD, the first gate voltage VEG1 may be a ground voltage (e.g., VSS), and if the off voltage Voff is the negative voltage VNEG based on the voltage detection signal SVD, the first gate voltage VEG1 may be the negative voltage VNEG.

The first body buffer circuit BB1 may output the first body voltage VEB1 having a voltage level determined based on the band selection signal SBS, the voltage detection signal SVD and the mode signal Smd. For example, when the band selection signal SBS is the corresponding band selection signal, the first body voltage VEB1 may be the ground voltage, and when the band selection signal SBS is not the band selection signal, the first body voltage VEB1 may be one of a ground voltage (e.g., VSS) and the negative voltage VNEG based on the voltage detection signal SVD and the mode signal Smd. That is, if the off voltage Voff is a ground voltage (e.g., VSS) based on the voltage detection signal SVD, the first body voltage VEB1 may be a ground voltage (e.g., VSS), and, in particular, if the off voltage Voff is the negative voltage VNEG based on the voltage detection signal SVD, the first body voltage VEB1 may be one of the negative voltage VNEG and a ground voltage (e.g., VSS) according to the mode signal Smd. For example, when the mode signal Smd has a high level, the first body voltage VEB1 may be a ground voltage (e.g., VSS), and when the mode signal Smd has a low level, the first body voltage VEB1 may be the negative voltage VNEG.

The first gate buffer circuit GB1 may output a positive voltage (for example, +VDD) as the first gate voltage VEG1 in a switching on mode, based on the band selection signal SBS, and one of the negative voltage VNEG and a ground voltage (e.g., VSS) may be output as the first gate voltage VEG1 based on the voltage detection signal SVD in a switching off mode, based on the band selection signal SBS.

For example, in the switching off mode, when the voltage detection signal SVD is a second voltage of a low level, the first gate buffer circuit GB1 may output a ground voltage, and when the voltage detection signal SVD is a first voltage of a high level, the first gate buffer circuit GB1 may output a negative voltage.

For example, the first gate buffer circuit GB1 may include a VNEG buffer B11 and a VSS buffer B12.

The VNEG buffer B11 may output one of a positive voltage (for example, +VDD) and a negative voltage (e.g., −VDD) as the first gate voltage VEG1 according to the band selection signal SBS when the voltage detection signal SVD is the first voltage of a high level.

When the voltage detection signal SVD is the second voltage of a low level, the VSS buffer B12 may output one of a positive voltage (for example, +VDD) and a ground voltage (e.g., VSS) as the first gate voltage VEG1 according to the band selection signal SBS.

The first body buffer circuit BB1 may output a ground voltage (e.g., VSS) as the first body voltage VEB1 in the switching on mode, based on the band selection signal SBS, and may output one of a negative voltage (e.g., +VNEG) and a ground voltage (e.g., VSS) as the first body voltage VEB1 based on the voltage detection signal SVD and the mode signal Smd in the switching off mode, based on the band selection signal SBS.

For example, in the switching off mode, when the voltage detection signal SVD is a second voltage of a low level, the first body buffer circuit BB1 may output a ground voltage, and when the voltage detection signal SVD is a first voltage of a high level, the first body buffer circuit BB1 may output one of a ground voltage and a negative voltage, based on the mode signal Smd.

For example, the first body buffer circuit BB1 may include a VNEG buffer B13 and a VSS buffer B14.

When the voltage detection signal SVD is the first voltage of a high level, the VNEG buffer B13 may output one of a ground voltage (e.g., VSS) and a negative voltage (e.g., −VDD) as the first body voltage VEB1 according to the band selection signal SBS.

When the voltage detection signal SVD is the second voltage of a low level, the VSS buffer B14 may or may not output a ground voltage (e.g., VSS) as the first body voltage VEB1 according to the band selection signal SBS.

Therefore, in the switching off mode, the first gate buffer circuit GB1 and the first body buffer circuit BB1 may output one of a pair of the negative voltage VNEG and the negative voltage VNEG, a pair of a ground voltage (e.g., VSS) and a ground voltage (e.g., VSS), and a pair of the negative voltage VNEG and a ground voltage (e.g., VSS), as a pair of the first gate voltage VEG1 and the first body voltage VEB1 based on the voltage detection signal SVD and the mode signal Smd.

Referring to FIG. 5, the second gate buffer circuit GB2 may output a first shunt gate voltage VHG1 having a voltage level determined based on the band selection signal SBS and the voltage detection signal SVD.

For example, when the band selection signal SBS is a corresponding band selection signal, the first shunt gate voltage VHG1 may be a positive voltage, and when the band selection signal SBS is not the corresponding band selection signal, the first shunt gate voltage VHG1 may be one of a ground voltage (e.g., VSS) and the negative voltage VNEG based on the voltage detection signal SVD. That is, if the off voltage Voff is a ground voltage (e.g., VSS) based on the voltage detection signal SVD, the first shunt gate voltage VHG1 may be a ground voltage (e.g., VSS) and if the off voltage Voff is the negative voltage VNEG, the first shunt gate voltage VHG1 may be the negative voltage VNEG.

The second body buffer circuit BB2 may output a first shunt body voltage VHB1 having a voltage level determined based on the band selection signal SBS, the voltage detection signal SVD and the mode signal Smd.

For example, when the band selection signal SBS is a corresponding band selection signal, the first shunt body voltage VHB1 may be the ground voltage, and when the band selection signal SBS is not the corresponding band selection signal, the first shunt body voltage VHB1 may be one of a ground voltage (e.g., VSS) and the negative voltage VNEG based on the voltage detection signal SVD and the mode signal Smd. That is, the first shunt body voltage VHB1 may be a ground voltage (e.g., VSS) when the off voltage Voff is a ground voltage (e.g., VSS) based on the voltage detection signal SVD, and the first shunt body voltage VHB1 may be the negative voltage VNEG or a ground voltage (e.g., VSS) according to the mode signal Smd if the off voltage Voff is the negative voltage VNEG.

The second gate buffer circuit GB2 may output a positive voltage (e.g., +VDD) as the first shunt gate voltage VHG1 in the switching on mode, based on the band selection signal SBS, and may output one of the negative voltage VNEG and a ground voltage (e.g., VSS) as the first shunt gate voltage VHG1 based on the voltage detection signal SVD in the switching off mode, based on the band selection signal SBS.

For example, in the switching off mode, when the voltage detection signal SVD is a second voltage of a low level, the second gate buffer circuit GB2 may output a ground voltage and when the voltage detection signal SVD is a first voltage of a high level, the second gate buffer circuit GB2 may output a negative voltage.

For example, the second gate buffer circuit GB2 may include a VNEG buffer B21 and a VSS buffer B22.

When the voltage detection signal SVD is the first voltage V1, the VNEG buffer B21 may output one of a positive voltage (e.g., +VDD) and a negative voltage (e.g., −VDD) as the first shunt gate voltage VHG1 according to the band selection signal SBS.

When the voltage detection signal SVD is the second voltage V1, the VSS buffer B22 may output one of a positive voltage (e.g., +VDD) and a ground voltage (e.g., VSS) as the first shunt gate voltage VHG1 according to the band selection signal SBS.

The second body buffer circuit BB2 may output a ground voltage (e.g., VSS) as the first shunt body voltage VHB1 in the switching on mode, based on the band selection signal SBS and may output one of the negative voltage VNEG and a ground voltage (e.g., VSS) as the first shunt body voltage VHB1 based on the voltage detection signal SVD and the mode signal Smd in the switching off mode, based on the band selection signal SBS.

For example, in the switching off mode, when the voltage detection signal SVD is a second voltage of a low level, the second body buffer circuit BB2 may output a ground voltage, and when the voltage detection signal SVD is a first voltage of a high level, the second body buffer circuit BB2 may output one of the ground voltage and the negative voltage, based on the mode signal Smd.

For example, the second body buffer circuit BB2 may include a VNEG buffer B23 and a VSS buffer B24.

When the voltage detection signal SVD is the first voltage of a high level, the VNEG buffer B23 may output one of a ground voltage (e.g., VSS) and a negative voltage (e.g., −VDD) as the first shunt body voltage VHB1 according to the band selection signal SBS.

When the voltage detection signal SVD is the second voltage of a low level, the VSS buffer B24 may or may not select a ground voltage (e.g., VSS) as the second body voltage VEB2 according to the band selection signal SBS.

Therefore, in the switching off mode, the second gate buffer circuit GB2 and the second body buffer circuit BB2 may output one of a pair of the negative voltage VNEG and the negative voltage VNEG, a pair of a ground voltage (e.g., VSS) and a ground voltage (e.g., VSS), and a pair of the negative voltage VNEG and a ground voltage (e.g., VSS) as a pair of the first shunt gate voltage VHG1 and the first shunt body voltage VHB1, based on the voltage detection signal SVD and the mode signal Smd.

Figure 6:
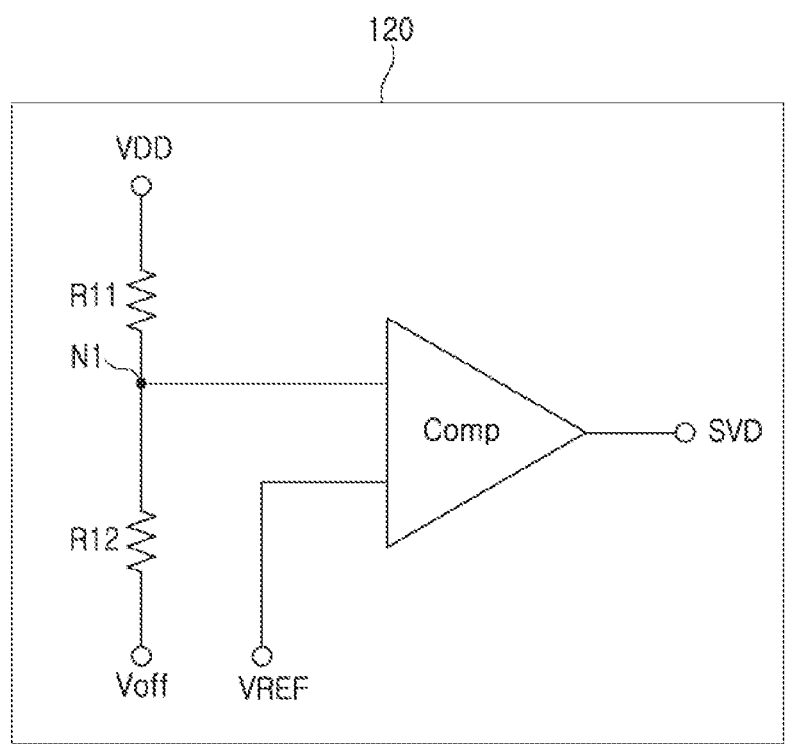
FIG. 6 is a diagram of an off voltage detection circuit according to an example.

FIG. 6 is an example diagram of an off voltage detection circuit according to an example.

Referring to FIG. 6, for example, the off voltage detection circuit 120 may include a comparator Comp. The comparator Comp may output a first resistor R11 and a second resistor R12 connected in series between a positive operating voltage VDD terminal and an off voltage Voff terminal and the voltage detection signal SVD including a level according to a comparison result by comparing a voltage detected from a connection node N1 between the first resistor R11 and the second resistor R12 with a reference voltage VREF.

For example, when the off voltage Voff is the negative voltage VNEG, since the voltage detected from the connection node N1 is lower than the reference voltage VREF, the comparator Comp may output the first voltage V1 (e.g., a low level voltage) as the voltage detection signal SVD, and when the off voltage Voff is the ground voltage VSS, since the voltage detected from the connection node N1 is higher than the reference voltage VREF, the comparator Comp may output the second voltage V2 (e.g., a high level voltage) having a magnitude different from the first voltage V1 as the voltage detection signal SVD.

Figure 7:
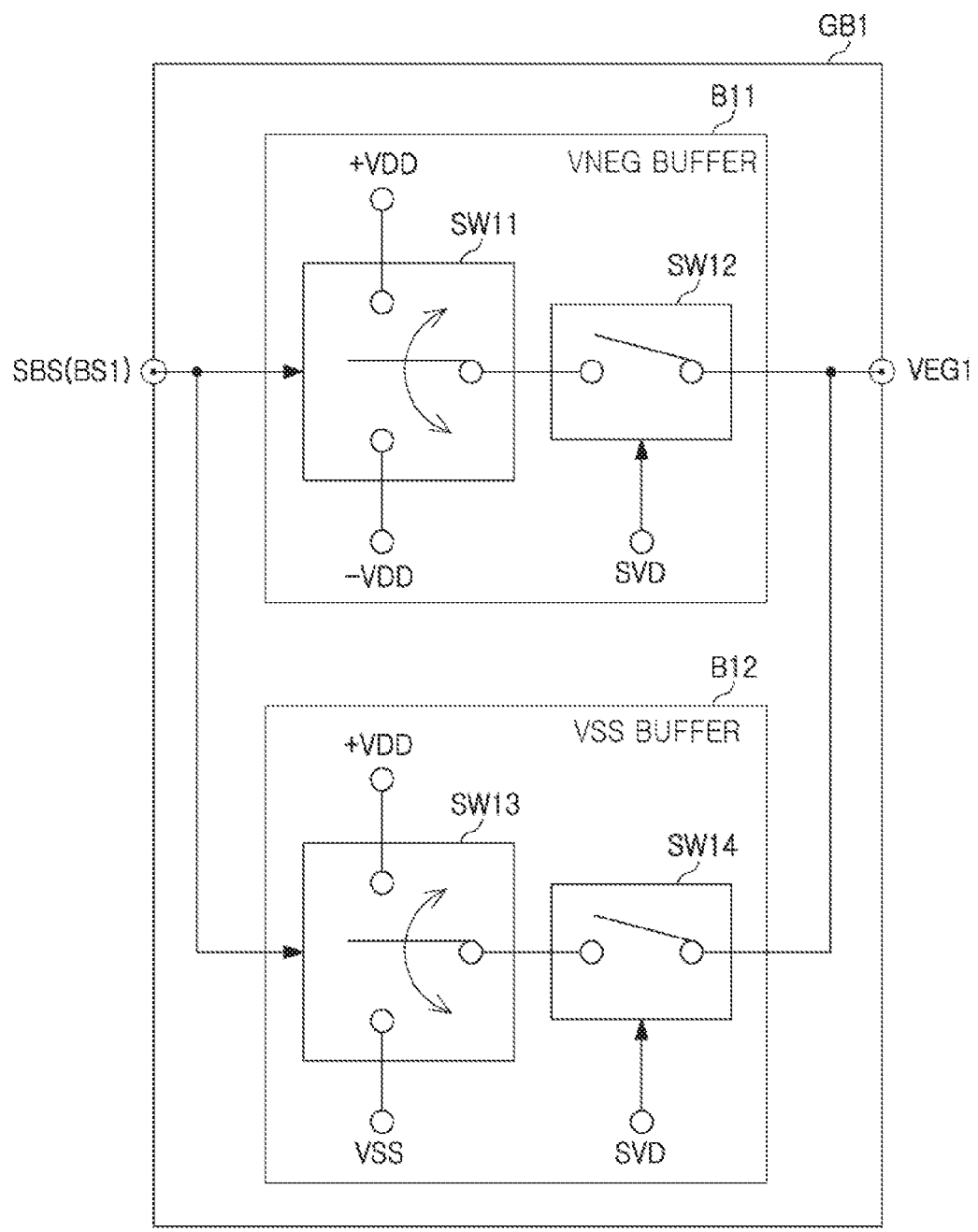
FIG. 7 is an example diagram of a first gate buffer of FIGS. 4 and 5.

FIG. 7 is an example diagram of a first gate buffer of FIGS. 4 and 5.

Referring to FIGS. 4, 5 and 7, the first gate buffer circuit GB1 may include the VNEG buffer B11 and the VSS buffer B12.

The VNEG buffer B11 may include a first switch SW11 and a second switch SW12.

For example, the first switch SW11 may select one of a positive voltage (e.g., +VDD) and a negative voltage (e.g., −VDD) as the first series gate voltage VEG1 according to the first band selection signal BS1 to the second switch SW12.

For example, if the first band select signal BS1 is a high level voltage, the first switch SW11 may select a positive voltage as the first series gate voltage VEG1, and if the first band select signal BS1 is a low level voltage, the first switch SW11 may select the negative voltage as the first series gate voltage VEG1.

The second switch SW12 may be in an on state when the voltage detection signal SVD is the first voltage V1 such that one of a positive voltage (e.g., +VDD) and a negative voltage (e.g., −VDD) selected by the first switch SW11 may be output as the first series gate voltage VEG1.

Unlike this, when the voltage detection signal SVD is the second voltage V2, the second switch SW12 may be in an off state.

Also, the VSS buffer B12 may include a third switch SW13 and a fourth switch SW14.

The third switch SW13 may select and output one of a positive voltage (e.g., +VDD) and a ground voltage (e.g., VSS) as the first series gate voltage VEG1 according to the first band selection signal BS1 to the fourth switch SW14.

For example, if the first band select signal BS1 is a high level voltage, the first series gate voltage VEG1 may be selected by the third switch SW13 as the positive voltage, and if the first band select signal BS1 is a low level voltage, the first series gate voltage VEG1 may be selected by the third switch SW13 as the ground voltage.

The fourth switch SW14 may be in an on state when the voltage detection signal SVD is the second voltage V2 such that one of the positive voltage (e.g., +VDD) and the ground voltage (e.g., VSS) selected by the third switch SW13 may be output as the first series gate voltage VEG1.

When the voltage detection signal SVD is the first voltage V1, the fourth switch SW14 may be in an off state.

Figure 8:
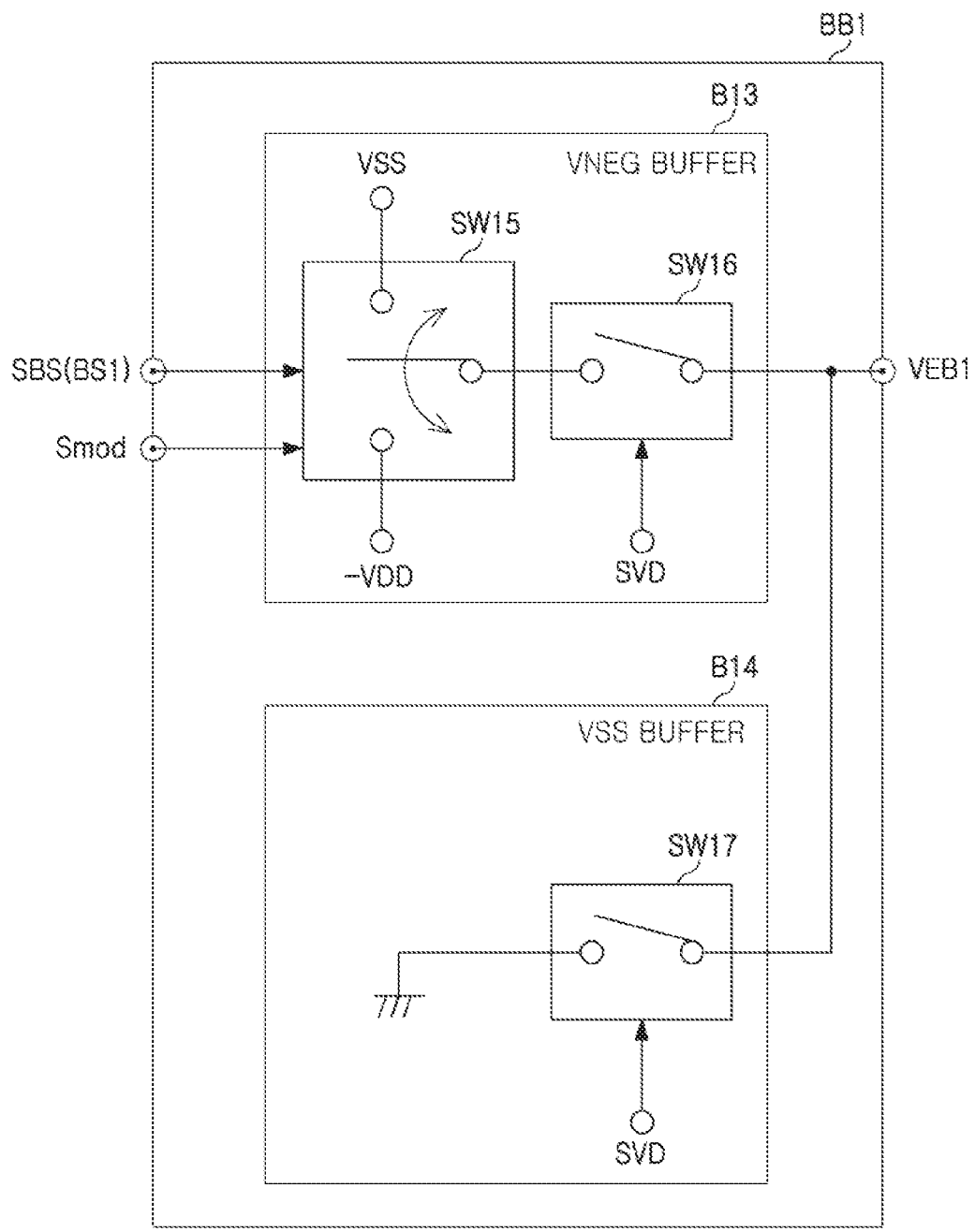
FIG. 8 is an example diagram of a first body buffer of FIGS. 4 and 5.

FIG. 8 is an example diagram of a first body buffer of FIGS. 4 and 5.

Referring to FIGS. 4 and 8, the first body buffer circuit BB1 may include a VNEG buffer B13 and a VSS buffer B14.

The VNEG buffer B13 may include a fifth switch SW15 and a sixth switch SW16.

For example, the fifth switch SW15 may select and output one of a ground voltage (e.g., VSS) and a negative voltage (e.g. −VDD) as the first series body voltage VEB1 according to the first band selection signal BS1 and the mode signal Smd to the sixth switch SW16.

For example, if the first band selection signal BS1 is a high level voltage, the ground voltage may be selected as the first series body voltage VEB1 by the fifth switch SW15, and if the first band selection signal BS1 is a low level voltage, the negative voltage may be selected as the first series body voltage VEB1 by the fifth switch SW15.

The sixth switch SW16 may be in an on state when the voltage detection signal SVD is the first voltage V1 such that one of the ground voltage (e.g., VSS) and the negative voltage (e.g. −VDD) selected by the first switch SW15 may be output as the first series body voltage VEB1.

When the voltage detection signal SVD is the second voltage V2, the sixth switch SW16 may be in an off state.

The VSS buffer B14 may include a seventh switch SW17.

The seventh switch SW17 may select and output a ground voltage (e.g., VSS) as the first series body voltage VEB1 according to the voltage detection signal SVD.

Upon further describing FIG. 8, the first body buffer circuit BB1 of FIG. 8 may further receive the mode signal Smd to select the first series body voltage VEB1. For example, when the off voltage Voff is a negative voltage, since the voltage detection signal SVD is a first voltage of a high level, the sixth switch SW16 is in an on state, and the seventh switch SW17 is in an off state, a body off voltage may be the negative voltage VDD or a ground voltage.

When the mode signal Smd has, for example, a high level, the body off voltage may be the negative voltage VDD and when the mode signal has a low level, the body off voltage may be the ground voltage VSS. That is, when the off voltage Voff may be a negative voltage and the VNEG buffer B13 operates, one of the negative voltage VDD and the ground voltage VSS may be selected as the body off voltage using the mode signal Smd.

Figure 9:
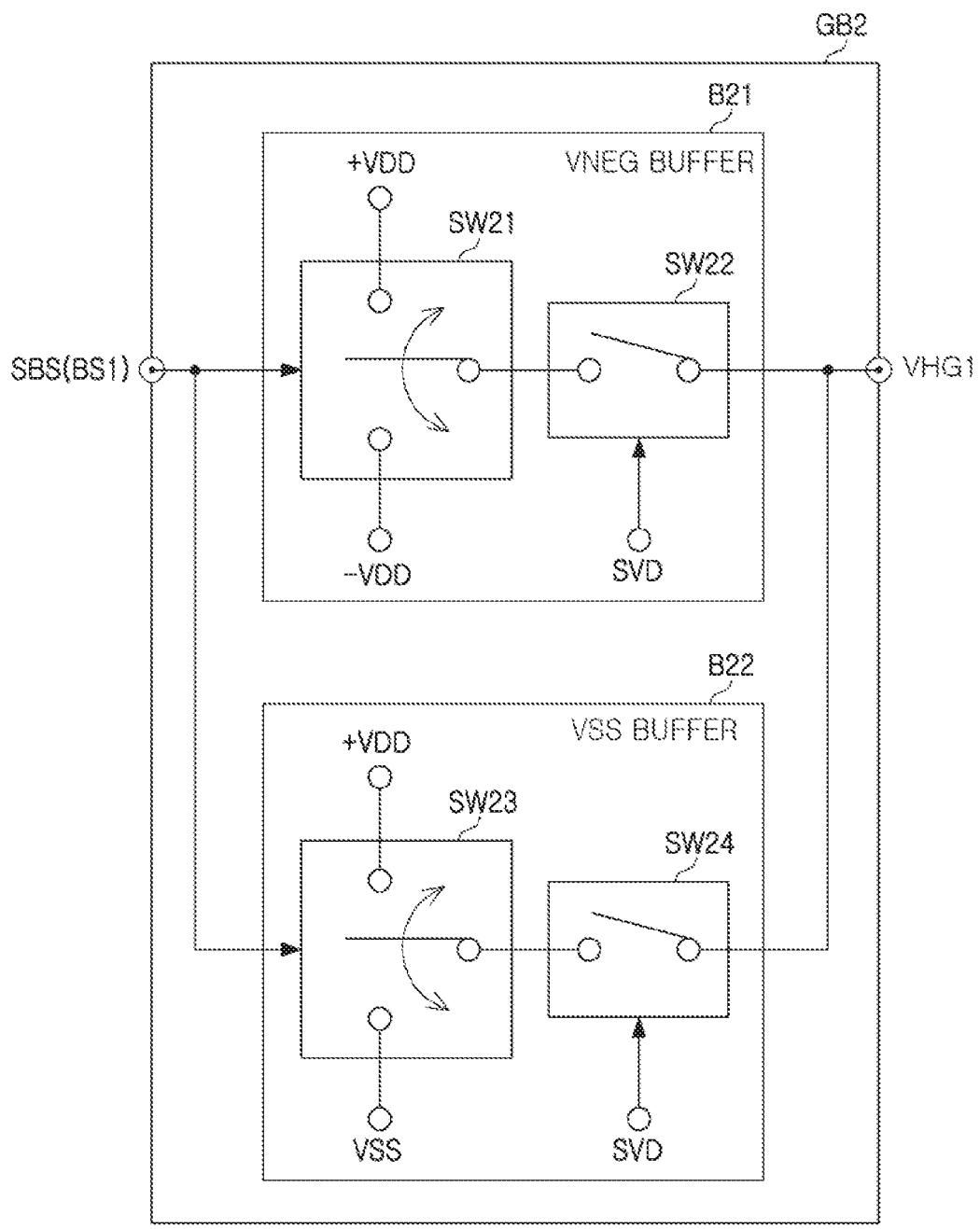
FIG. 9 is an example diagram of a second gate buffer of FIGS. 4 and 5.

FIG. 9 is an example diagram of a second gate buffer of FIGS. 4 and 5.

Referring to FIGS. 4, 5 and 9, the VNEG buffer B21 may include a first switch SW21 and a second switch SW22.

For example, the first switch SW21 may select and output one of a positive voltage (e.g., +VDD) and a negative voltage (e.g., −VDD) as the first shunt gate voltage VHG1 according to the first band selection signal BS1 to the second switch SW22.

For example, if the first band selection signal BS1 is a high level voltage, the negative voltage may be selected as the first shunt gate voltage VHG1 by the first switch SW21, and if the first band selection signal BS1 is a low level voltage, the ground voltage may be selected as the first shunt gate voltage VHG1 by the first switch SW21.

The second switch SW22 may be in an on state when the voltage detection signal SVD is the first voltage V1 such that one of the positive voltage (e.g., +VDD) and the negative voltage (e.g., −VDD) selected by the first switch SW21 may be output as the first shunt gate voltage VHG1.

When the voltage detection signal SVD is the second voltage V2, the second switch SW22 may be in an off state.

The VSS buffer B22 may include a third switch SW23 and a fourth switch SW24.

The third switch SW23 may select and output one of a positive voltage (e.g., +VDD) and a ground voltage (e.g., VSS) as the first shunt gate voltage VHG1 according to the first band selection signal BS1 to the fourth switch SW24.

For example, if the first band selection signal BS1 is a high level voltage, the ground voltage may be selected by the third switch SW23 as the first shunt gate voltage VHG1, and if the first band selection signal BS1 is a low level voltage, the positive voltage may be selected by the third switch SW23 as the first shunt gate voltage VHG1.

The fourth switch SW24 may be in an on state when the voltage detection signal SVD is the second voltage V2 such that one of the positive voltage (e.g., +VDD) and the ground voltage (e.g., VSS) selected by the third switch SW23 may be output as the first shunt gate voltage VHG1.

Alternatively, when the voltage detection signal SVD is the first voltage V1, the fourth switch SW24 may be in an off state.

Figure 10:
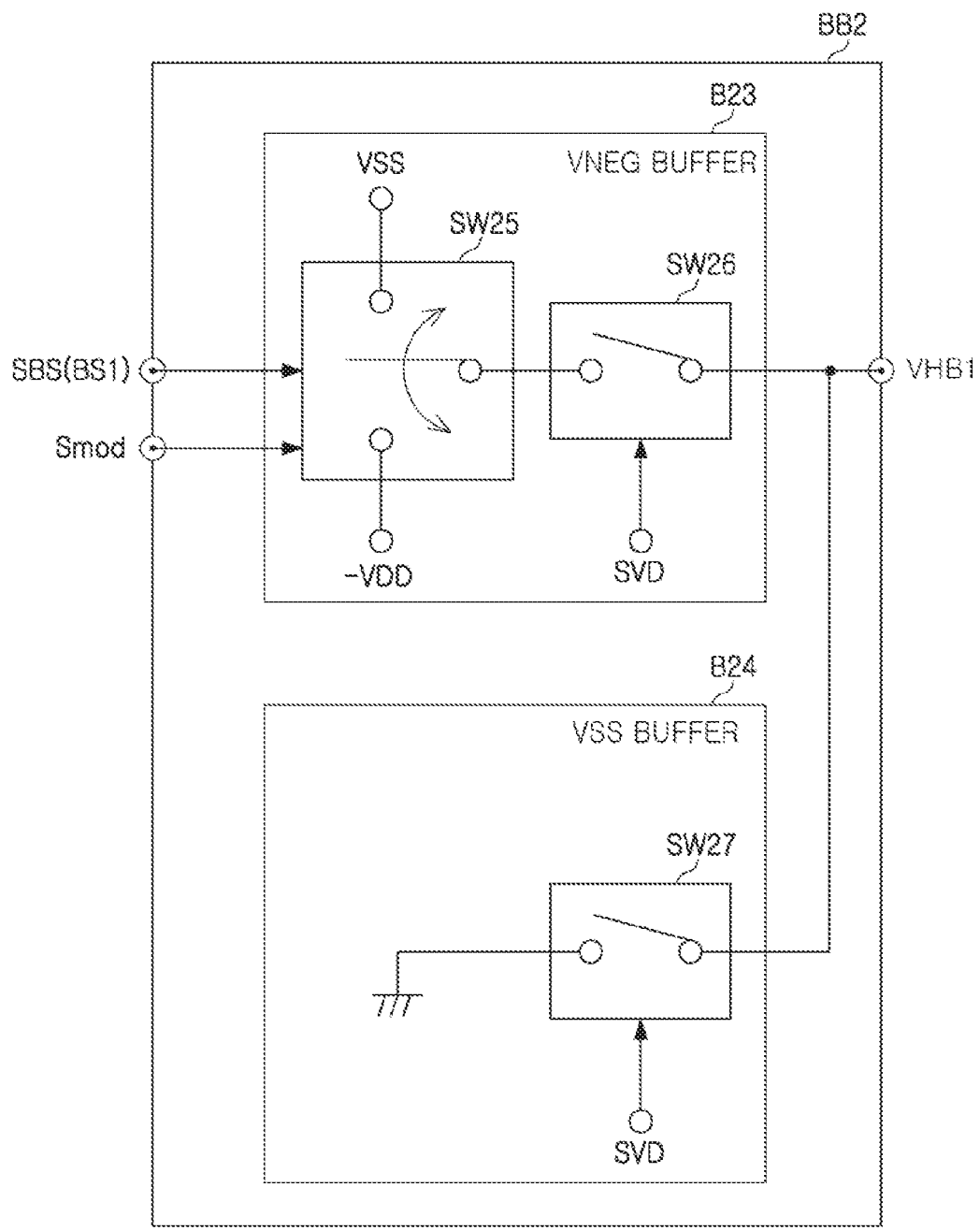
FIG. 10 is an example diagram of a second body buffer of FIGS. 4 and 5.

FIG. 10 is an example diagram of a second body buffer of FIGS. 4 and 5.

Referring to FIGS. 4, 5 and 10, the second body buffer circuit BB2 may include a VNEG buffer B23 and a VSS buffer B24.

The VNEG buffer B23 may include a fifth switch SW25 and a sixth switch SW26.

For example, the fifth switch SW25 may select and output one of a ground voltage (e.g., VSS) and a negative voltage (e.g., −VDD) as the first shunt body voltage VHB1 according to the first band selection signal BS1 and the mode signal Smd to the sixth switch SW26.

For example, if the first band selection signal BS1 is a high level voltage, the ground voltage may be selected as the first shunt body voltage VHB1 by the fifth switch SW25, and if the first band selection signal BS1 is a low level voltage, the negative voltage may be selected as the first shunt body voltage VHB1 by the fifth switch SW25.

The sixth switch SW26 may be in an on state when the voltage detection signal SVD is the first voltage V1 such that one of the ground voltage (e.g., VSS) and the negative voltage (e.g., −VDD) selected by the first switch SW25 may be output as the first shunt body voltage VHB1.

When the voltage detection signal SVD is the second voltage V2, the sixth switch SW26 may be in an off state.

The VSS buffer B24 may include a seventh switch SW27.

The seventh switch SW27 may be in an on state when the voltage detection signal SVD is the second voltage V2 according to the first band selection signal BS1 and the mode signal Smd.

When the voltage detection signal SVD is the second voltage V2, the seventh switch SW27 may be in an off state.

Upon further describing FIG. 10, the second body buffer circuit BB2 of FIG. 10 may further receive the mode signal Smd to select the first shunt body voltage VHB1. For example, when the off voltage Voff is a negative voltage, since the voltage detection signal SVD is a first voltage of a high level, the sixth switch SW26 is in an on state, and the seventh switch SW27 is in an off state, a body off voltage may be the negative voltage VDD or a ground voltage.

When the mode signal Smd, for example, has a high level, the body off voltage may be the negative voltage VDD and when the mode signal has a low level, the body off voltage may be the ground voltage VSS. That is, when the off voltage Voff is the negative voltage and the VNEG buffer B23 operates, one of the negative voltage VDD and the ground voltage VSS may be selected as the body off voltage using the mode signal Smd.

Figure 11:
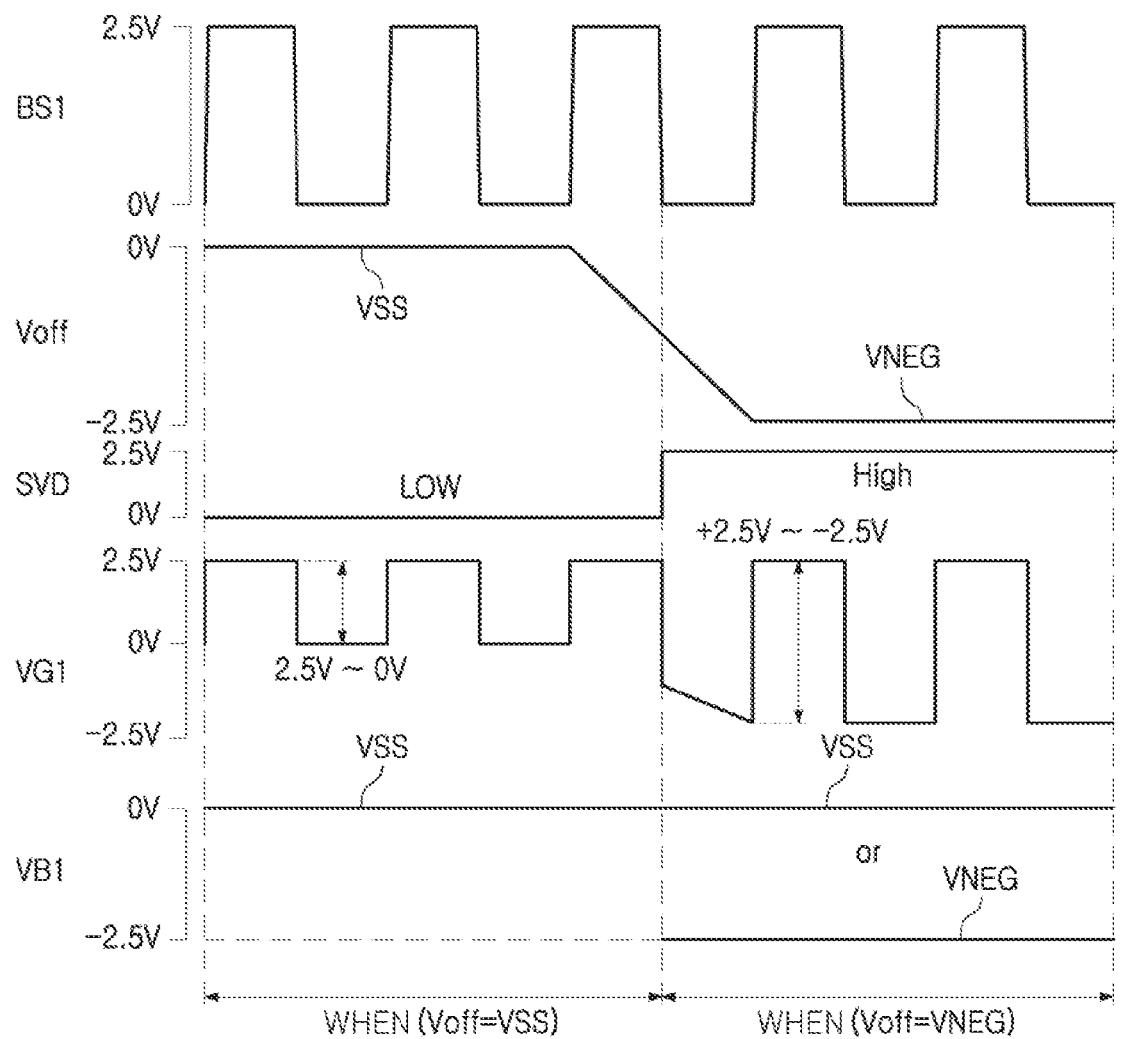
FIG. 11 is a diagram of voltage levels of a first band selection signal, an off voltage, a voltage detection signal, a first gate voltage, and a first body voltage according to an example.

FIG. 11 is an example diagram of voltage levels of the first band selection signal BS1, the off voltage Voff, the voltage detection signal SVD, the first gate voltage VG1, and the first body voltage VB1 according to an example.

In FIG. 11, a case where, for example, the first band selection signal BS1 alternately includes a high level voltage (for example, +2.5V) and a low level voltage (for example, 0V), the off voltage Voff is changed from a ground voltage (for example, VSS=0 V) to a negative voltage (for example, −VDD=−2.5) will be described.

For example, when the off voltage Voff is the ground voltage (for example, VSS=0 V), the voltage detection signal SVD may have a low level, and the first gate voltage VG1 may be +2.5 V or 0 V in synchronization with the voltage level of the first band selection signal BS1, and the first body voltage VB1 may be 0 V regardless of the voltage level of the first band selection signal BS1.

For another example, when the off voltage Voff is the negative voltage (e.g., −VDD=−2.5), the voltage detection signal SVD may have a high level and the first gate voltage VG1 may be +2.5V or −2.5V in synchronization with the voltage level of the first band selection signal BS1, and the first body voltage VB1 may be 0V or −2.5V in synchronization with the voltage level of the band selection signal BS1.

By selecting one of a ground voltage and a negative voltage according to an off voltage input in an off state, the corresponding required performance may be satisfied according to an applied arrangement position, and thus an application range of a radio frequency switch device may be extended.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A control buffer circuit of a radio frequency switch, the control buffer circuit comprising:
    an off voltage detection circuit configured to detect whether an off voltage, supplied from an external source, is a negative voltage or a ground voltage and output a voltage detection signal having a voltage level based on whether the off voltage is the negative voltage or the ground voltage;
    a first gate buffer circuit configured to output a first gate voltage having a voltage level based on the voltage detection signal and a band selection signal; and
    a first body buffer circuit configured to output a first body voltage having a voltage level based on the voltage detection signal, the band selection signal, and a mode signal.

2. The control buffer circuit of claim 1, wherein in a case in which the off voltage is the ground voltage, the first body voltage is the ground voltage, and in a case in which the off voltage is the negative voltage, the first body voltage is one of the negative voltage and the ground voltage, according to the mode signal.

3. The control buffer circuit of claim 2, wherein the first gate buffer circuit comprises:
    a VNEG buffer configured to output one of a positive voltage and the negative voltage as the first gate voltage according to a first band selection signal in a case in which the voltage detection signal is a first voltage; and
    a VSS buffer configured to output one of the positive voltage and the ground voltage as the first gate voltage according to the first band selection signal in a case in which the voltage detection signal is a second voltage.

4. The control buffer circuit of claim 3, wherein the first body buffer circuit comprises:
    a VNEG buffer configured to output one of the ground voltage and the negative voltage as the first body voltage according to the first band selection signal in the case in which the voltage detection signal is the first voltage; and
    a VSS buffer configured to output the ground voltage as the first body voltage according to the first band selection signal in the case in which the voltage detection signal is the second voltage.

5. The control buffer circuit of claim 4, wherein the first gate buffer circuit is configured to:
    output the positive voltage as the first gate voltage in a switching on mode, based on the band selection signal; and
    output one of the negative voltage and the ground voltage as the first gate voltage in a switching off mode, based on the voltage detection signal and the band selection signal.

6. The control buffer circuit of claim 5, wherein the first body buffer circuit is configured to:
    output the ground voltage as the first body voltage in the switching on mode, based on the band selection signal; and
    output one of the negative voltage and the ground voltage as the first body voltage in the switching off mode, based on the voltage detection signal, the mode signal, and the band selection signal.

7. The control buffer circuit of claim 6, wherein the first gate buffer circuit and the first body buffer circuit are configured to output, in the switching off mode, based on the voltage detection signal and the mode signal, as a pair of the first gate voltage and the first body voltage, one of a pair of the negative voltage and the negative voltage, a pair of the ground voltage and the ground voltage, and a pair of the negative voltage and the ground voltage.

8. The control buffer circuit of claim 1, wherein the off voltage detection circuit is configured to:
    output the voltage detection signal with a first voltage in a case in which the off voltage is the negative voltage; and
    output the voltage detection signal with a second voltage different from the first voltage in a case in which the off voltage is the ground voltage.

9. A radio frequency switch comprising:
    a control buffer circuit configured to generate a first gate voltage and a first body voltage, based on a band selection signal, an off voltage supplied from an external source, and a mode signal; and
    a switching circuit configured to switch at least one signal path in response to the first gate voltage and the first body voltage,
    wherein the control buffer circuit comprises:
    an off voltage detection circuit configured to detect whether the off voltage is a negative voltage or a ground voltage and output a voltage detection signal having a voltage level based on whether the off voltage is the negative voltage or the ground voltage;
    a first gate buffer circuit configured to output the first gate voltage having a voltage level based on the voltage detection signal and the band selection signal; and
    a first body buffer circuit configured to output the first body voltage having a voltage level based on the voltage detection signal, the band selection signal, and the mode signal.

10. The radio frequency switch of claim 9, wherein in a case in which the off voltage is the ground voltage, the first body voltage is the ground voltage, and in a case in which the off voltage is the negative voltage, the first body voltage is one of the negative voltage and the ground voltage, according to the mode signal.

11. The radio frequency switch of claim 10, wherein the first gate buffer circuit comprises:
    a VNEG buffer configured to output one of a positive voltage and the negative voltage as the first gate voltage according to a first band selection signal in a case in which the voltage detection signal is a first voltage; and
    a VSS buffer configured to output one of the positive voltage and the ground voltage as the first gate voltage according to the first band selection signal in a case in which the voltage detection signal is a second voltage.

12. The radio frequency switch of claim 11, wherein the first body buffer circuit comprises:
a VNEG buffer configured to output one of the ground voltage and the negative voltage as the first body voltage according to the first band selection signal in the case in which the voltage detection signal is the first voltage; and
a VSS buffer configured to output the ground voltage as the first body voltage according to the first band selection signal in the case in which the voltage detection signal is the second voltage.

13. The radio frequency switch of claim 12, wherein the first gate buffer circuit is configured to:
output the positive voltage as the first gate voltage in a switching on mode, based on the band selection signal; and
output one of the negative voltage and the ground voltage as the first gate voltage in a switching off mode, based on the voltage detection signal and the band selection signal.

14. The radio frequency switch of claim 13, wherein the first body buffer circuit is configured to:
output the ground voltage as the first body voltage in the switching on mode, based on the band selection signal; and
output one of the negative voltage and the ground voltage as the first body voltage in the switching off mode, based on the voltage detection signal, the mode signal, and the band selection signal.

15. The radio frequency switch of claim 14, wherein the first gate buffer circuit and the first body buffer circuit are configured to output, in the switching off mode, based on the voltage detection signal and the mode signal, as a pair of the first gate voltage and the first body voltage, one of a pair of the negative voltage and the negative voltage, a pair of the ground voltage and the ground voltage, and a pair of the negative voltage and the ground voltage.

16. The radio frequency switch of claim 15, wherein the off voltage detection circuit is configured to output the voltage detection signal having a first voltage when the off voltage is the negative voltage and is configured to output the voltage detection signal having a second voltage different from the first voltage when the off voltage is the ground voltage.

\* \* \* \* \*